United States Patent
Lim

(10) Patent No.: US 8,189,308 B2
(45) Date of Patent: May 29, 2012

(54) INTEGRATED CIRCUIT

(75) Inventor: Dong-Ju Lim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 217 days.

(21) Appl. No.: 12/641,963

(22) Filed: Dec. 18, 2009

(65) Prior Publication Data

US 2010/0165524 A1  Jul. 1, 2010

(30) Foreign Application Priority Data

Dec. 31, 2008  (KR) .................. 10-2008-0138426

(51) Int. Cl.
*H02H 3/20* (2006.01)
*H02H 3/22* (2006.01)

(52) U.S. Cl. ............ 361/54; 361/56; 361/91.1; 361/111

(58) Field of Classification Search .................. 361/56, 361/93.1, 54, 91.1, 111
See application file for complete search history.

(56) References Cited

U.S. PATENT DOCUMENTS

| | | | |
|---|---|---|---|
| 5,708,550 A | 1/1998 | Avery | |
| 6,078,487 A * | 6/2000 | Partovi et al. | 361/56 |
| 6,826,026 B2 * | 11/2004 | Duvvury et al. | 361/56 |
| 7,196,378 B2 * | 3/2007 | Ichikawa | 257/357 |
| 7,339,770 B2 * | 3/2008 | Maloney et al. | 361/56 |
| 7,990,666 B2 * | 8/2011 | Riviere et al. | 361/56 |

FOREIGN PATENT DOCUMENTS

| | | |
|---|---|---|
| JP | 11-513879 | 11/1999 |
| KR | 1020000071680 | 11/2000 |
| KR | 1020010059287 | 7/2001 |
| KR | 1020010061378 | 7/2001 |

OTHER PUBLICATIONS

Notice of Allowance issued from Korean Intellectual Property Office on Oct. 27, 2010.

* cited by examiner

*Primary Examiner* — Rexford N Barnie
*Assistant Examiner* — Zeev V Kitov
(74) *Attorney, Agent, or Firm* — IP & T Group LLP

(57) ABSTRACT

An integrated circuit includes an input/output pad for signal exchange with an external circuit, an electrostatic discharge (ESD) protection unit coupled to the input/output pad and configured to form an ESD path between a first voltage line and a second voltage line, a first drive transistor coupled between the first voltage line and the input/output pad, a first driving control unit coupled to a gate of the first drive transistor and configured to control the first drive transistor, a first dummy drive transistor coupled between the first voltage line and the input/output pad, and a first auxiliary driving control unit configured to supply the first voltage to a gate of the first dummy drive transistor in a normal operation mode, and float the gate of the first dummy drive transistor in a non-operation mode in which no power is supplied.

15 Claims, 3 Drawing Sheets

INTEGRATED CIRCUIT

CROSS-REFERENCE TO RELATED APPLICATION

The present application claims priority of Korean Patent Application No. 10-2008-0138426, filed on Dec. 31, 2008, which is incorporated herein by reference in its entirety.

BACKGROUND OF THE INVENTION

Exemplary embodiments of the present invention relate to a semiconductor design technology, and more particularly, to a technology for protecting internal elements and internal circuits from electrostatic discharge (ESD).

Among internal circuits of integrated circuits (IC), semiconductor memory devices, and semiconductor devices, circuits configured with metal oxide semiconductor (MOS) components have high gate input impedance. Hence, gate oxide layers of MOS devices may be easily damaged by ESD. However, in fabricating high-performance and highly-integrated semiconductor devices, the thickness of gate oxide layers of transistors included in internal circuits is being decreased. Therefore, semiconductor devices are often provided with ESD protection circuits for protecting internal circuits from ESD.

Integrated circuits/semiconductor devices may be exposed to ESD during fabrication processes or in single-product states. This state is a non-operation state where no power is supplied because the integrated circuits/semiconductor devices are not yet mounted on electronic systems for normal operations.

Standard models for simulating ESD phenomenon are used to evaluate the tolerance and performance of ESD protection circuits and analyze the effect of ESD on the internal circuits. Generally, three ESD modeling methods are commonly used. The first ESD modeling method is a Human Body Model (HBM) which simulates the electrostatic charges charged in a human body that are discharged to a semiconductor device. The second ESD modeling method is a Machine Model (MM) which simulates the electrostatic charges charged in conductive machines that are discharged to a semiconductor device during semiconductor fabrication processing. The third ESD modeling method is a Charged Device Model (CDM) which simulates the electrostatic charges charged inside of a semiconductor device that are discharged to an external ground or conductor during fabrication processing, e.g., a packaging process. Electrostatic charges, i.e., positive charges or negative charges, charged in semiconductor devices are discharged by, for example, physical contact. Therefore, a flow direction of charges is determined by the polarity of charged charges.

An ESD protection circuit is configured with grounded-gate metal oxide semiconductor field effect transistor (ggMOSFET), gate-coupled MOSFET (gcMOSFET), bipolar junction transistor (BiT), diode, or other MOS components. When ESD occurs, the ggMOSFET, for example, clamps a voltage due to a parasitic BJT formed therein, and an over current flows through the ggMOSFET. During a normal operation in which no ESD occurs, the ESD protection circuit of the semiconductor device does not operate as a parasitic capacitance component, but may exhibit other properties such as a leakage current.

FIG. 1 illustrates a configuration of a conventional integrated circuit.

Referring to FIG. 1, the integrated circuit includes an input/output pad DQ, ESD protection units 10A and 10B, a pull-up drive transistor MP1, a first driving control unit 11UP, a dummy pull-up drive transistor MP2, a pull-down drive transistor MN1, a second driving control unit 11DN, and a dummy pull-down drive transistor MN2. Specifically, the input/output pad DQ is used for signal exchange with an external circuit. The ESD protection units 10A and 10B are connected to the input/output pad DQ to form an ESD path between a power supply voltage (VDD) line 13A and a ground voltage (VSS) line 13B. The pull-up drive transistor MP1 is connected between the VDD line 13A and the input/output pad DQ. The first driving control unit 11UP is connected to a gate of the pull-up drive transistor MP1 and configured to control the pull-up drive transistor MN. The dummy pull-up drive transistor MP2 is connected between the VDD line 13A and input/output pad DQ and has a gate connected to the VDD line 13A. The pull-down drive transistor MN1 is connected between the VSS line 13B and the input/output pad DQ. The second driving control unit 11DN is connected to a gate of the pull-down drive transistor MN1 and configured to control the pull-down drive transistor MN1. The dummy pull-down drive transistor MN2 is connected between the VSS line 13B and the input/output pad DQ and has a gate connected to the VSS line 13B.

The integrated circuit further includes a voltage clamping unit 12 connected between the VDD line 13A and the VSS line 13B. When a transient voltage or a transient current exceeds a certain level, the voltage clamping unit 12 forms an ESD path between the VDD line 13A and the VSS line 13B.

The ESD protection units 10A and 10B are configured with ggMOSFET, gcMOSFET, BJT, diode, and other MOS components. When ESD occurs, the ESD protection units 10A and 10B form a current path between the VDD line 13A and the VSS line 13B, thereby protecting the internal elements and internal circuits from over currents.

The internal circuit 14 controls the operations of the first driving control unit 11UP and the second driving control unit 11DN. The first driving control unit 11UP and the second driving control unit 11DN are also called a pre-driving unit.

The dummy pull-up drive transistor MP2 and the dummy pull-down drive transistor MN2 upon occurrence of ESD operate in the same manner as the pull-up drive transistor MP1 and the pull-down drive transistor MN1, that is, as a main output driving unit, due to the configuration of the integrated circuit. However, the dummy pull-up drive transistor MP2 and the dummy pull-down drive transistor MN2 do not drive the input/output pad DQ normally. The dummy drive transistors MP2 and MN2 are also referred to as "option fingers," and the drive transistors MP1 and MN1 are also referred to as "driver fingers."

The configuration and operation of the integrated circuit illustrated in FIG. 1 will be described below in detail.

In a normal operation mode, when power is supplied, a power supply voltage VDD is applied to a gate of the dummy pull-up drive transistor MP2, which is implemented with a PMOS transistor. In this case, since the dummy pull-up drive transistor MP2 maintains an off state, it does not affect signals transferred on the input/output pad DQ. Specifically, when the first driving control unit 11UP outputs a signal of a VSS level, the pull-up drive transistor MP1 is turned on to pull up the input/output pad DQ to the power supply voltage VDD. However, the dummy pull-up drive transistor MP2 maintains an off state in the normal operation mode.

Meanwhile, since no power is supplied to the VDD line 13A in a non-operation mode, an output terminal N1 of the first driving control unit 11UP and an output terminal N2 of the second driving control unit 11DN are set to a floating state. Thus, the gates of the pull-up drive transistor MP1 and the pull-down drive transistor MN1 are set to a floating state.

When ESD occurs at the input/output pad DQ, a voltage generated by static electricity is applied to the dummy drive transistors MP2 and MN2 and the drive transistors MP1 and MN1 until a current path is formed between VDD line 13A and VSS line 13B through the ESD protection units 10A and 10B. Due to the large voltage accompanying ESD, the dummy drive transistors MP2 and MN2 and the drive transistors MP1 and MN1 causes an over current to flow through the transistor due to the parasitic BJTs formed therein. However, while the gates of the drive transistors MP1 and MN1 are in a floating state, the gates of the dummy drive transistors MP2 and MN2 are connected to the VDD line 13A and the VSS line 13B, respectively. Therefore, trigger voltages at which the drive transistors MP1 and MN1 are turned on are lower than those of the drive transistors MP2 and MN2. In other words, since the drive transistors MP1 and MN1 are first turned on at ESD voltages lower than ESD voltages applied to the dummy drive transistors MP2 and MN2 to turn them on. Therefore, excessive stress is generated in the drive transistors MP1 and MN1 at an early stage, causing the damage of the drive transistors MP1 and MN1.

SUMMARY OF THE INVENTION

An embodiment of the present invention is directed to an integrated circuit which is capable of improving tolerance against ESD by controlling a dummy output driving circuit coupled to a pad.

In accordance with another embodiment of the present invention, an apparatus includes: an input/output pad for signal exchange with an external circuit; an electrostatic discharge (ESD) protection unit coupled to the input/output pad and configured to form an ESD path between a first voltage line and a second voltage line; a first drive transistor coupled between the first voltage line and the input/output pad; a first driving control unit coupled to a gate of the first drive transistor and configured to control the first drive transistor; a first dummy drive transistor coupled between the first voltage line and the input/output pad; and a first auxiliary driving control unit configured to supply the first voltage to a gate of the first dummy drive transistor in a normal operation mode, and float the gate of the first dummy drive transistor in a non-operation mode in which no power is supplied. The integrated circuit may further include a second drive transistor coupled between the second voltage line and the input/output pad; a second driving control unit coupled to a gate of the second drive transistor and configured to control the second drive transistor; a second dummy drive transistor coupled between the second voltage line and the input/output pad; and a second auxiliary driving control unit configured to supply a second voltage of the second voltage line to the gate of the second dummy drive transistor in the normal operation mode, and float the gate of the second dummy drive transistor in the non-operation mode.

The integrated circuit may further include a voltage clamping unit coupled between the first voltage line and the second voltage line.

The first voltage may be a power supply voltage, the first drive transistor and the first dummy drive transistor are pull-up drive transistors.

In accordance with yet another embodiment of the present invention, an apparatus includes an input/output pad for signal exchange with an external circuit; electrostatic discharge (ESD) protection units coupled to the input/output pad to form an ESD path between a first power supply voltage line and a first ground voltage line; a pull-up drive transistor coupled between the first power supply voltage line and the input/output pad; a first driving control unit coupled to a gate of the pull-up drive transistor and configured to control the pull-up drive transistor; a dummy pull-up drive transistor coupled between the first power supply voltage line and the input/output pad; and a first auxiliary driving control unit configured to a second power supply voltage to a gate of the dummy pull-up drive transistor in a normal operation mode, and floats the gate of the dummy pull-up drive transistor in a non-operation mode in which no power is supplied.

The integrated circuit may further include a pull-down drive transistor connected between the first ground voltage line and the input/output pad; a second driving control unit connected to a gate of the pull-down drive transistor and configured to control the pull-down drive transistor; a dummy pull-down drive transistor is connected between the first ground voltage line and the input/output pad; and a second auxiliary driving control unit supplies a second ground voltage to a gate of the dummy pull-down drive transistor in the normal operation mode, and floats the gate of the dummy pull-down drive transistor in the non-operation mode in which no power is supplied.

The integrated circuit of may further include voltage clamping units configured to provide ESD paths between the first and second power supply voltage lines and the first and second ground voltage lines.

DESCRIPTION OF SPECIFIC EMBODIMENTS

Figure 1:
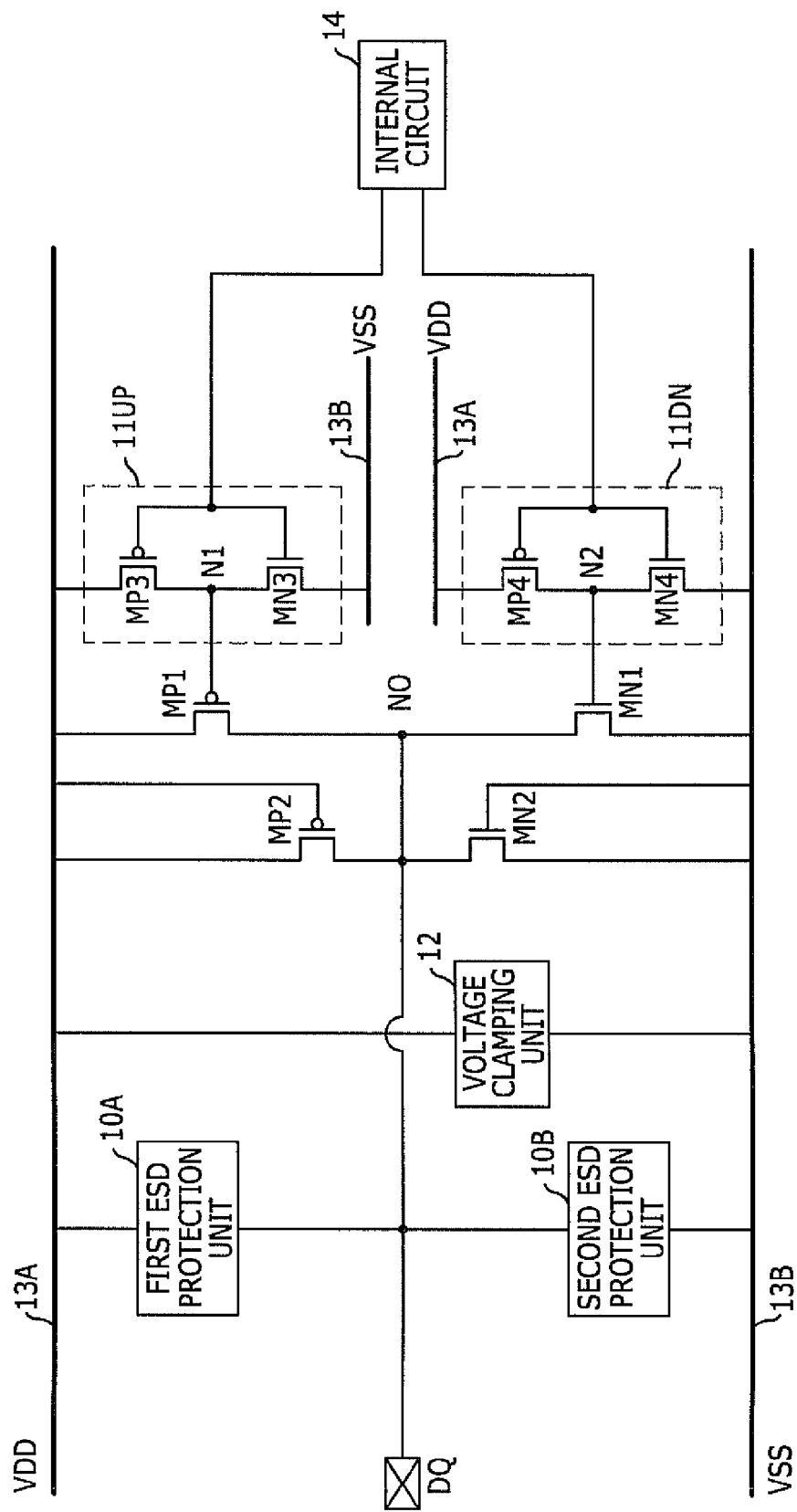
FIG. 1 illustrates a configuration of a conventional IC.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Logic signals of circuits may be classified into high level (H) or low level (L) according to voltage levels, which are also represented by "1" or "0", respectively. In some cases, the logic signals may further have a high impedance (Hi-Z) state. Moreover, P-channel Metal Oxide Semiconductor (PMOS) transistors and N-channel Metal Oxide Semiconductor (NMOS) transistors used herein may be types of Metal Oxide Semiconductor Field-Effect Transistors (MOSFET).

Figure 2:
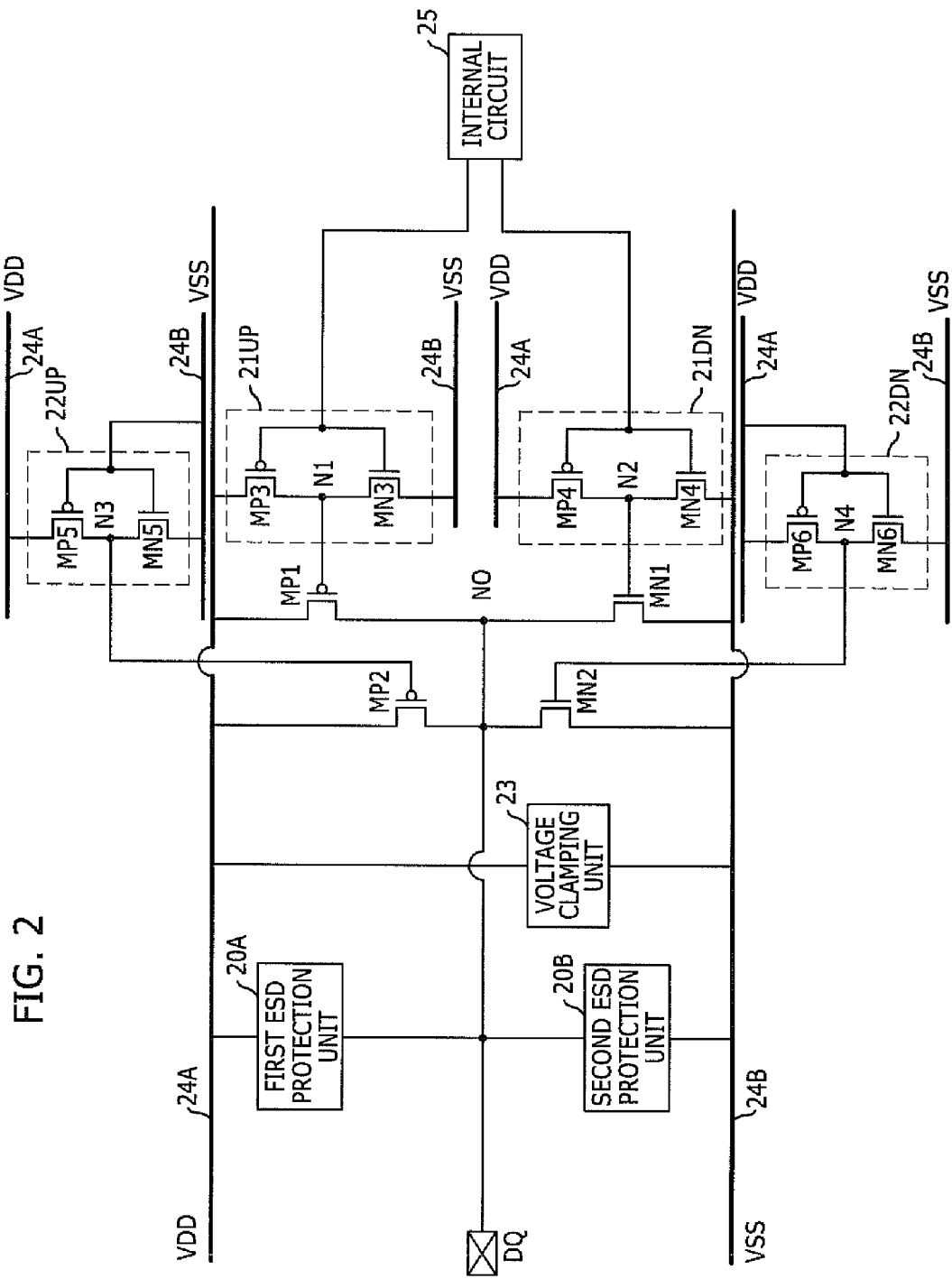
FIG. 2 illustrates a configuration of an integrated circuit, in accordance with an embodiment of the present invention.

FIG. 2 illustrates a configuration of an integrated circuit in accordance with an embodiment of the present invention.

Referring to FIG. 2, the integrated circuit includes an input/output pad DQ, ESD protection units 20A and 20B, a pull-up drive transistor MP1, a first driving control unit 21UP, a dummy pull-up drive transistor MP2, a first auxiliary driving control unit 22UP, a pull-down drive transistor MN1, a second driving control unit 21DN, a dummy pull-down drive transistor MN2, and a second auxiliary driving control unit 22DN.

Specifically, the input/output pad DQ is used for signal exchange with an external circuit. The ESD protection units 20A and 20B are connected to the input/output pad DQ to form an ESD path with a power supply voltage (VDD) line 24A and a ground voltage (VSS) line 24B. The pull-up drive transistor MP1 is connected between the VDD line 24A and the input/output pad DQ. The first driving control unit 21UP is connected to a gate of the pull-up drive transistor MP1 and configured to control the pull-up drive transistor MP1. The dummy pull-up drive transistor MP2 is connected between the VDD line 24A and input/output pad DQ. The first auxiliary driving control unit 22UP supplies a power supply voltage VDD to a gate of the dummy pull-up drive transistor MP2 in a normal operation mode, and floats the gate of the dummy pull-up drive transistor MP2 in a non-operation mode in which no power is supplied. The pull-down drive transistor MN1 is connected between the VSS line 24B and the input/output pad DQ. The second driving control unit 21DN is connected to a gate of the pull-down drive transistor MN1 and configured to control the pull-down drive transistor MN1. The dummy pull-down drive transistor MN2 is connected between the VSS line 24B and the input/output pad DQ. The second auxiliary driving control unit 22DN supplies a ground voltage VSS to a gate of the dummy pull-down drive transistor MN2 in the normal operation mode, and floats the gate of the dummy pull-down drive transistor MN2 in the non-operation mode in which no power is supplied.

The integrated circuit further includes a voltage clamping unit 23 connected between the VDD line 24A and the VSS line 24B. When a transient voltage or a transient current exceeds a certain level, the voltage clamping unit 23 forms an ESD path between the VDD line 24A and the VSS line 24B.

The ESD protection units 20A and 20B are configured with ggMOSFET, gcMOSFET, BJT, diode, and other MOS components. When ESD occurs, the ESD protection units 20A and 20B form a current path between the VDD line 24A and the VSS line 24B, thereby protecting the internal elements and internal circuits from over currents.

The internal circuit 25 controls the operations of the first driving control unit 21UP and the second driving control unit 21DN. The first driving control unit 21UP and the second driving control unit 21DN are also called a pre-driving unit.

Upon occurrence of ESD, the dummy pull-up drive transistor MP2 and the dummy pull-down drive transistor MN2 are designed to operate in the same manner as the pull-up drive transistor MP1 and the pull-down drive transistor MN1, that is, as a main output driving unit, due to the configuration of the integrated circuit. However, the dummy pull-up drive transistor MP2 and the dummy pull-down drive transistor MN2 do not drive the input/output pad DQ in the normal operation mode.

The configuration and operation of the integrated circuit illustrated in FIG. 2 will be described below in detail.

In this embodiment, the first auxiliary driving control unit 22UP includes a PMOS transistor MP5 connected between the VDD line 24A and an output terminal N3, and an NMOS transistor MN5 connected between the output terminal N3 and the VSS line 24B. Gates of the PMOS transistor MP5 and the NMOS transistor MN5 are commonly connected to the VSS line 24B. In a normal operation mode, when power is supplied, the PMOS transistor MP5 is turned on and a power supply voltage VDD is applied through the output terminal N3 to the gate of the dummy pull-up drive transistor MP2. Since the power supply voltage VDD is applied to the gate of the dummy pull-up drive transistor MP2, which is a PMOS transistor, the dummy pull-up drive transistor MP2 maintains an off state. Hence, the dummy pull-up drive transistor MP2 does not affect signals transferred on the input/output pad DQ. As to the pull-up drive transistor MP1, when the first driving control unit 21UP outputs a signal of a VSS level, the pull-up drive transistor MP1 is turned on to pull up the input/output pad DQ to the power supply voltage VDD. However, as described above, the dummy pull-up drive transistor MP2 maintains an off state in the normal operation mode.

Furthermore, the second auxiliary driving control unit 22DN includes a PMOS transistor MP6 connected between the VDD line 24A and an output terminal N4, and an NMOS transistor MN6 connected between the output terminal N4 and the VSS line 24B. Gates of the PMOS transistor MP6 and the NMOS transistor MN6 are commonly connected to the VDD line 24A. In a normal operation mode, when power is supplied, the NMOS transistor MN6 is turned on and a ground voltage VSS is applied through the output terminal N4 to the gate of the dummy pull-down drive transistor MN2. Since the ground voltage VSS is applied to the gate of the dummy pull-down drive transistor MN2, which is configured with an NMOS transistor, the dummy pull-down drive transistor MN2 maintains an off state. Hence, the dummy pull-down drive transistor MN2 does not affect signals transferred on the input/output pad DQ. As to the pull-down drive transistor MN1, when the second driving control unit 21DN outputs a signal of a VSS level, the pull-down drive transistor MN1 is turned on to pull down the input/output pad DQ to the ground voltage VSS. However, as described above, the dummy pull-down drive transistor MN2 maintains an off state in the normal operation mode.

In a non-operation mode, no power is supplied to the VDD line 24A. Since an output terminal N3 of the first auxiliary driving control unit 22UP and an output terminal N4 of the second auxiliary driving control unit 22DN are set to a floating state in a non-operation mode, the gates of the dummy pull-up drive transistor MP2 and the dummy pull-down drive transistor MN2 are set to a floating state. In addition, since an output terminal N1 of the first driving control unit 21UP and an output terminal N2 of the second driving control unit 21DN are set to a floating state, the gates of the pull-up drive transistor MP1 and the pull-down drive transistor MN1 are set to a floating state.

When ESD occurs in the input/output pad DQ, a voltage generated by static electricity is applied to the dummy drive transistors MP2 and MN2 and the drive transistors MP1 and MN1 until a current path is formed between the voltage lines VDD line 24A and VSS line 24B through the ESD protection units 20A and 20B. Upon occurrence of the large voltage accompanying ESD, the dummy drive transistors MP2 and MN2 and the drive transistors MP1 and MN1 each perform the same operations and cause an over current to flow through them due to the parasitic BJTs formed therein. Since the gates of the dummy drive transistors MP2 and MN2 and the gates of the drive transistors MP1 and MN1 are in a floating state, the dummy drive transistors MP2 and MN2 and the drive transistors MP1 and MN1 are turned on (that is, BJTs formed therein due to overvoltages are turned on) at the same trigger voltage. Therefore, an over current path is formed by the VDD line 24A and the VSS line 24B at the same time through the dummy drive transistors MP2 and MN2 and the drive transistors MP1 and MN1. Consequently, excessive stress is not generated in the drive transistors MP1 and MN1, thereby increasing tolerance against ESD.

Figure 3:
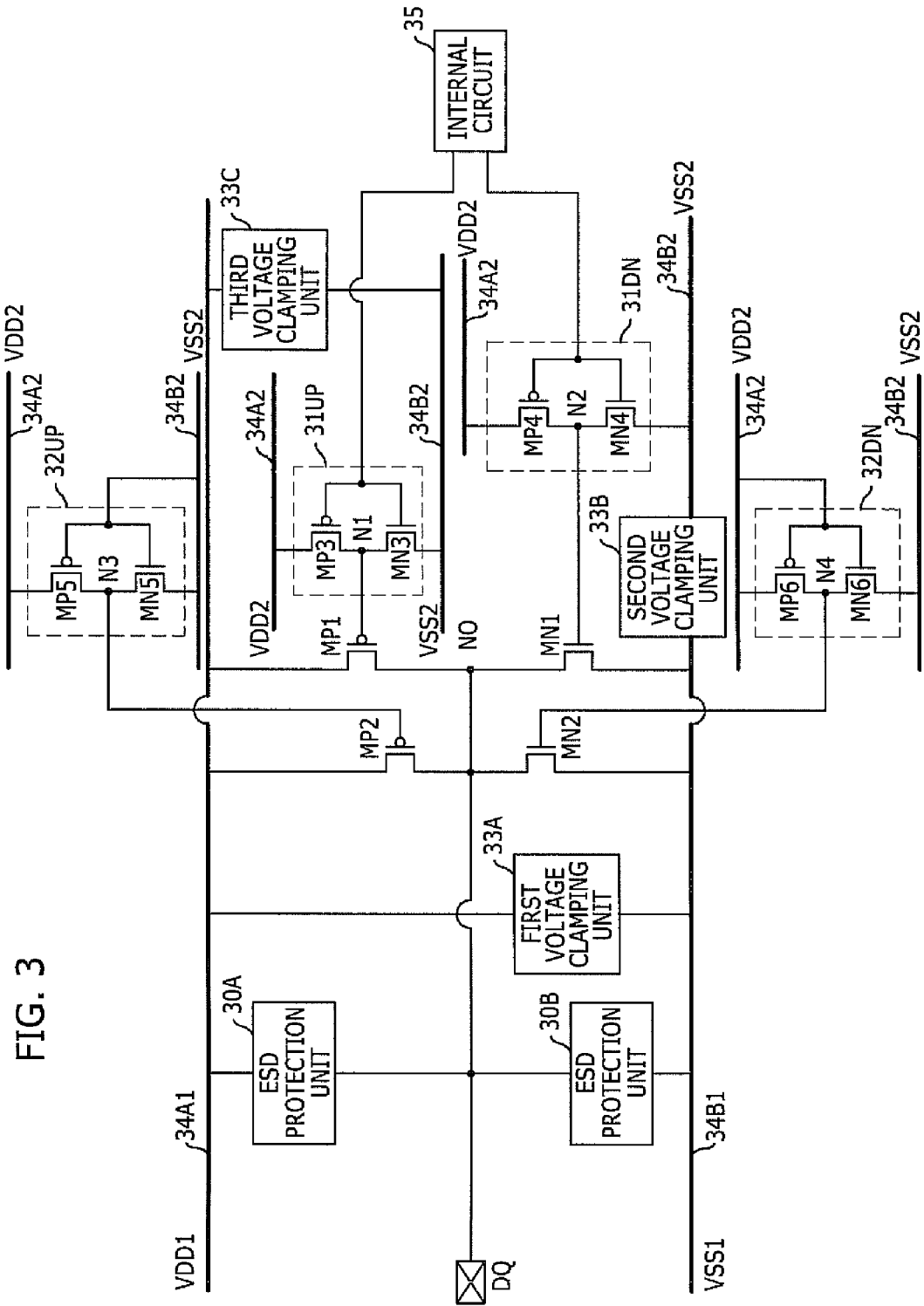
FIG. 3 illustrates a configuration of an integrated circuit in accordance with another embodiment of the present invention.

FIG. 3 illustrates a configuration of an integrated circuit in accordance with another embodiment of the present invention.

Referring to FIG. 3, the integrated circuit includes an input/output pad DQ, ESD protection units 30A and 30B, a pull-up drive transistor MP1, a first driving control unit 31UP, a dummy pull-up drive transistor MP2, a first auxiliary driving control unit 32UP, a pull-down drive transistor MN1, a second driving control unit 31DN, a dummy pull-down drive transistor MN2, and a second auxiliary driving control unit 32DN. Specifically, the input/output pad DQ is used for signal exchange with an external circuit. The ESD protection units 30A and 3013 are connected to the input/output pad DQ to form an ESD path between a first power supply voltage (VDD1) line 34A1 and a first ground voltage (VSS1) line 34B1. The pull-up drive transistor MP1 is connected between the VDD1 line 34A1 and the input/output pad DQ. The first driving control unit 31UP is connected to a gate of the pull-up drive transistor MP1 and configured to control the pull-up drive transistor MP1. The dummy pull-up drive transistor MP2 is connected between the VDD1 line 34A1 and input/output pad DQ. The first auxiliary driving control unit 32UP supplies a second power supply voltage VDD2 to a gate of the dummy pull-up drive transistor MP2 in a normal operation mode, and floats the gate of the dummy pull-up drive transistor MP2 in a non-operation mode in which no power is supplied. The pull-down drive transistor MN1 is connected between the VSS1 line 34B1 and the input/output pad DQ. The second driving control unit 31DN is connected to a gate of the pull-down drive transistor MN1 and configured to control the pull-down drive transistor MN1. The dummy pull-down drive transistor MN2 is connected between the VSS1 line 34B1 and the input/output pad DQ. The second auxiliary driving control unit 32DN supplies a second ground voltage VSS2 to a gate of the dummy pull-down drive transistor MN2 in the normal operation mode, and floats the gate of the dummy pull-down drive transistor MN2 in the non-operation mode in which no power is supplied.

The elements and basic operations of the integrated circuit of FIG. 3 are substantially similar to those of the integrated circuit of FIG. 2.

While the integrated circuit of FIG. 2 operates using the single power supply voltage VDD and the single ground voltage VSS, the integrated circuit of FIG. 3 operates using first and second power supply voltages VDD1 and VDD2 and first and second ground voltages VSS1 and VSS2. The integrated circuit includes three voltage clamping units 33A, 33B and 33C in order to provide ESD paths between the additional voltage lines.

In this embodiment, when a transient voltage or a transient current exceeds a certain level, the three voltage clamping units 33A, 33B and 33C form ESD paths among the voltage lines 34A1, 34B1, 34A2 and 34B2.

The ESD protection units 30A and 30B are each configured with ggMOSFET, gcMOSFET, BJT, diode, and other MOS components. When ESD occurs, the ESD protection units 30A and 30B form a current path between the voltage lines, thereby protecting the internal elements and internal circuits from over currents.

The internal circuit 35 controls the operations of the first driving control unit 31UP and the second driving control unit 31DN. The first driving control unit 31UP and the second driving control unit 31DN are also called a pre-driving unit.

When ESD occurs, the dummy pull-up drive transistor MP2 and the dummy pull-down drive transistor MN2 are designed to operate in the same manner as the pull-up drive transistor MP1 and the pull-down drive transistor MN1, that is, as a main output driving unit, due to the configuration of the integrated circuit. However, the dummy pull-up drive transistor MP2 and the dummy pull-down drive transistor MN2 do not drive the input/output pad DQ normally.

The configuration and operation of the integrated circuit illustrated in FIG. 3 will be described below in detail.

In this embodiment, the first auxiliary driving control unit 32UP includes a PMOS transistor MP5 connected between the VDD2 line 34A2 and an output terminal N3, and an NMOS transistor MN5 connected between the output terminal N3 and the VSS2 line 34B2. Gates of the PMOS transistor MP5 and the NMOS transistor MN5 are commonly connected to the VSS2 line 34B2. In a normal operation mode, when power is supplied, the PMOS transistor MP5 is turned on and the second power supply voltage VDD2 is applied through the output terminal N3 to the gate of the dummy pull-up drive transistor MP2. Since the second power supply voltage VDD2 is applied to the gate of the dummy pull-up drive transistor MP2, which is a PMOS transistor, the dummy pull-up drive transistor MP2 maintains an off state. Hence, it does not affect signals transferred on the input/output pad DQ. As to the pull-up drive transistor MP1, when the first driving control unit 31UP outputs a signal of a VSS2 level, the pull-up drive transistor MP1 is turned on to pull up the input/output pad DQ to the first power supply voltage VDD1. However, as described above, the dummy pull-up drive transistor MP2 maintains an off state in the normal operation mode.

Furthermore, the second auxiliary driving control unit 32DN includes a PMOS transistor MP6 connected between the VDD2 line 34A2 and an output terminal N4, and an NMOS transistor MN6 connected between the output terminal N4 and the VSS2 line 34B2. Gates of the PMOS transistor MP6 and the NMOS transistor MN6 are commonly connected to the VDD2 line 34A2. In a normal operation mode, when power is supplied, the NMOS transistor MN6 is turned on and the second ground voltage VSS2 is applied through the output terminal N4 to the gate of the dummy pull-down drive transistor MN2. Since the second ground voltage VSS2 is applied to the gate of the dummy pull-down drive transistor MN2 configured with an NMOS transistor, the dummy pull-down drive transistor MN2 maintains an off state. Hence, the dummy pull-down drive transistor MN2 does not affect signals transferred on the input/output pad DQ. As to the pull-down drive transistor MN1, when the second driving control unit 31DN outputs a signal of a VSS2 level, the pull-down drive transistor MN1 is turned on to pull down the input/output pad DQ to the first ground voltage VSS1. However, as described above, the dummy pull-down drive transistor MN2 maintains an off state in the normal operation mode.

In a non-operation mode, no power is supplied to the VDD1 line 34A1 and the VDD2 line 34A2. Since an output terminal N3 of the first auxiliary driving control unit 32UP and an output terminal N4 of the second auxiliary driving control unit 32DN are set to a floating state, the gates of the dummy pull-up drive transistor MP2 and the dummy pull-down drive transistor MN2 are set to a floating state. In addition, since an output terminal N1 of the first driving control unit 31UP and an output terminal N2 of the second driving control unit 31DN are set to a floating state, the gates of the pull-up drive transistor MP1 and the pull-down drive transistor MN1 are set to a floating state.

When ESD occurs in the input/output pad DQ, a voltage generated by static electricity is applied to the dummy drive transistors MP2 and MN2 and the drive transistors MP1 and MN1 until a current path is formed between the voltage lines VDD1 and VSS1 through the ESD protection units 30A and 30B. Upon occurrence of the large voltage accompanying ESD, the dummy drive transistors MP2 and MN2 and the drive transistors MP1 and MN1 each perform the same operations and cause an over current to flow through them due to the parasitic BJTs formed therein. Since the gates of the dummy drive transistors MP2 and MN2 and the gates of the drive transistors MN and MN1 are in a floating state, the dummy drive transistors MP2 and MN2 and the drive transistors MP1 and MN1 are turned on (that is, BJTs formed therein due to overvoltage are turned on) at the same trigger voltage. Therefore, an over current path is formed between the voltage lines VDD1 and VSS1 at the same time through the dummy drive transistors MP2 and MN2 and the drive transistors MP1 and MN1. Consequently, excessive stress is not generated in the drive transistors MP1 and MN1, thereby increasing tolerance against ESD.

In the integrated circuits, in accordance with the exemplary embodiments of the present invention, when ESD occurs, the dummy output driving circuits and the output driving circuits connected to the pad are all turned on. Therefore, the trigger voltages at which the over current is discharged through the dummy output driving circuits and the output driving circuits are controlled to be equal. Consequently, tolerance of the output driving circuits against ESD is increased. Moreover, the overall circuit area is not increased because the number of additional elements provided for implementation of the integrated circuits in accordance with the exemplary embodiments of the present invention is relatively small.

The voltage polarities representing activation states of signals and circuits may be changed according to embodiments.

Furthermore, various modifications may be made in the structure of the integrated circuits while achieving same functions. For example, the PMOS transistors and the NMOS transistors may be exchanged for one another with appropriate corresponding changes in the integrated circuits. Moreover, various modifications may be made in logic gate structures while achieving same functions. For example, NAND logics, NOR logics, and so on may be implemented by various combinations of NAND gates, NOR gates, inverters, etc.

While the input/output pad according to an exemplary embodiment has been explained in the context of specific environments, it is apparent that the present invention can be applied in other environments such as On Die Termination (ODT) circuits in which a dummy driving unit and a driving unit are connected to the same pad.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
an input/output pad for signal exchange with an external circuit;
an electrostatic discharge (ESD) protection unit coupled to the input/output pad and configured to form an ESD path between a first voltage line and a second voltage line;
a first drive transistor coupled between the first voltage line and the input/output pad;
a first driving control unit coupled to a gate of the first drive transistor and configured to control the first drive transistor;
a first dummy drive transistor coupled between the first voltage line and the input/output pad; and
a first auxiliary driving control unit configured to supply a first voltage of the first voltage line to a gate of the first dummy drive transistor in a normal operation mode, and float the gate of the first dummy drive transistor in a non-operation mode in which no power is supplied,
wherein the first auxiliary driving control unit comprises:
a first transistor coupled between the first voltage line and an output terminal; and
a second transistor coupled between the output terminal and the second voltage line, gates of the first transistor and the second transistor being commonly and directly coupled to the second voltage line.

2. The integrated circuit of claim 1, further comprising:
a second drive transistor coupled between the second voltage line and the input/output pad;
a second driving control unit coupled to a gate of the second drive transistor and configured to control the second drive transistor;
a second dummy drive transistor coupled between the second voltage line and the input/output pad; and
a second auxiliary driving control unit configured to supply a second voltage of the second voltage line to the gate of the second dummy drive transistor in the normal operation mode, and float the gate of the second dummy drive transistor in the non-operation mode.

3. The integrated circuit of claim 2, further comprising a voltage clamping unit coupled between the first voltage line and the second voltage line.

4. The integrated circuit of claim 2, wherein:
the first voltage is a power supply voltage,
the first drive transistor and the first dummy drive transistor are pull-up drive transistors.

5. The integrated circuit of claim 2, wherein:
the first voltage is a ground voltage,
the second voltage is a power supply voltage, and
the first drive transistor and the first dummy drive transistor are pull-down drive transistors.

6. The integrated circuit of claim 2, wherein:
the first voltage is a power supply voltage,
the second voltage is a ground voltage,
the first drive transistor and the first dummy drive transistor are pull-up drive transistors, and
the second drive transistor and the second dummy drive transistor are pull-down drive transistors.

7. The integrated circuit of claim 3, wherein:
the first voltage is a power supply voltage,
the second voltage is a ground voltage,
the first drive transistor and the first dummy drive transistor are pull-up drive transistors, and
the second drive transistor and the second dummy drive transistor are pull-down drive transistors.

8. The integrated circuit of claim 1, wherein:
the first voltage is a power supply voltage,
the second voltage is a ground voltage,
the first transistor is a PMOS transistor, and
the second transistor is an NMOS transistor.

9. The integrated circuit of claim 2, wherein the first auxiliary driving control unit comprises:
a first transistor coupled between the first voltage line and a first output terminal; and
a second transistor coupled between the first output terminal and the second voltage line, gates of the first transistor and the second transistor being commonly coupled to the second voltage line.

10. The integrated circuit of claim 9, wherein the second auxiliary driving control unit comprises:
a third transistor coupled between the first voltage line and a second output terminal;
a fourth transistor coupled between the second output terminal and the second voltage line, gates of the third transistor and the fourth transistor being commonly coupled to the first voltage line.

11. The integrated circuit of claim 10, wherein:
the first voltage is a power supply voltage,
the second voltage is a ground voltage, the first and third transistors are PMOS transistors, and
the second and fourth transistors are NMOS transistors.

12. An integrated circuit, comprising:
an input/output pad for signal exchange with an external circuit;
electrostatic discharge (ESD) protection units coupled to the input/output pad to form an ESD path between a first power supply voltage line and a first ground voltage line;
a pull-up drive transistor coupled between the first power supply voltage line and the input/output pad;
a first driving control unit coupled to a gate of the pull-up drive transistor and configured to control the pull-up drive transistor;
a dummy pull-up drive transistor coupled between the first power supply voltage line and the input/output pad; and
a first auxiliary driving control unit configured to provide a second power supply voltage to a gate of the dummy pull-up drive transistor in a normal operation mode, and floats the gate of the dummy pull-up drive transistor in a non-operation mode in which no power is supplied,
wherein the first auxiliary driving control unit comprises:
a first transistor coupled between the first voltage line and an output terminal; and
a second transistor coupled between the output terminal and the second voltage line, gates of the first transistor and the second transistor being commonly and directly coupled to the second voltage line.

13. The integrated circuit of claim 12, further comprising:
a pull-down drive transistor connected between the first ground voltage line and the input/output pad;
a second driving control unit connected to a gate of the pull-down drive transistor and configured to control the pull-down drive transistor;
a dummy pull-down drive transistor is connected between the first ground voltage line and the input/output pad; and
a second auxiliary driving control unit supplies the second ground voltage to a gate of the dummy pull-down drive transistor in the normal operation mode, and floats the gate of the dummy pull-down drive transistor in the non-operation mode in which no power is supplied.

14. The integrated circuit of claim 13, further comprising:
voltage clamping units configured to provide ESD paths between the first and second power supply voltage lines and the first and second ground voltage lines.

15. The integrated circuit of claim 2, wherein:
the second voltage is a ground voltage, and
the first drive transistor and the first dummy drive transistor are pull-up drive transistors.

* * * * *